(12) United States Patent
Lu et al.

(10) Patent No.: US 8,030,992 B2
(45) Date of Patent: Oct. 4, 2011

(54) LOW-PASS FILTER

(75) Inventors: Rui-Hong Lu, Shuishang Shiang (TW); Sheng-Fu Hsu, Taipei (TW)

(73) Assignee: System General Corp., Shin-Dian (TW)

( * ) Notice: Subject to any disclaimer, the term of this patent is extended or adjusted under 35 U.S.C. 154(b) by 0 days.

(21) Appl. No.: 12/328,202

(22) Filed: Dec. 4, 2008

(65) Prior Publication Data
US 2010/0090758 A1 Apr. 15, 2010

(30) Foreign Application Priority Data
Oct. 10, 2008 (CN) .......................... 2008 1 0167310

(51) Int. Cl.
*H03K 5/00* (2006.01)
(52) U.S. Cl. ........ 327/554; 327/552; 327/558; 327/337; 327/156

(58) Field of Classification Search .......... 327/551–559, 327/147–159, 336–337
See application file for complete search history.

(56) References Cited

U.S. PATENT DOCUMENTS

| | | | | |
|---|---|---|---|---|
| 5,708,573 A | * | 1/1998 | Lusher et al. | 363/47 |
| 6,466,146 B1 | * | 10/2002 | Huang | 341/143 |
| 7,471,140 B2 | * | 12/2008 | Salerno | 327/551 |
| 2004/0155702 A1 | * | 8/2004 | Danielsson | 327/552 |

* cited by examiner

*Primary Examiner* — Dinh T. Le
(74) *Attorney, Agent, or Firm* — Ming Chow; Sinorica, LLC

(57) ABSTRACT

A low-pass filter of the present invention comprises a plurality of filter units and a regulation unit. The filter units are coupled in series with each other and receive an input signal to filter the input signal for generating an output signal. The regulation unit is coupled to the filter units to regulate voltage levels of the filter units. The low-pass filter of the present invention can be integrated within the integrated circuit and reduce the prime cost.

13 Claims, 4 Drawing Sheets

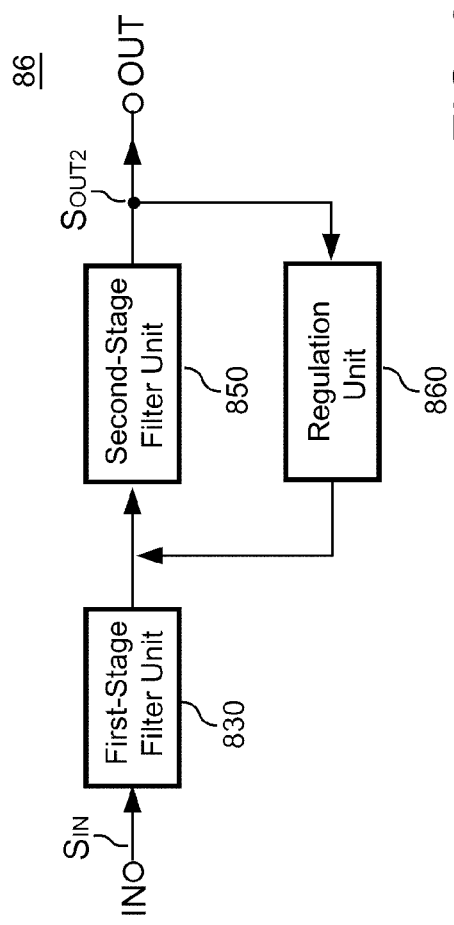
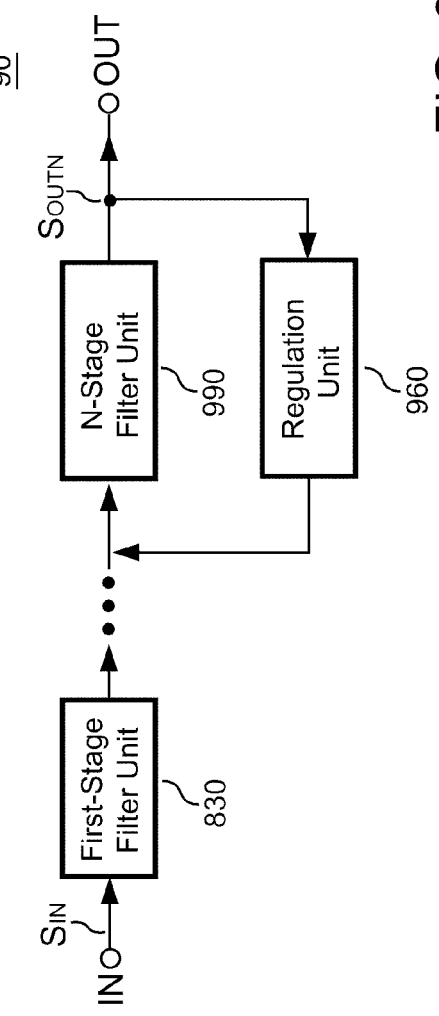
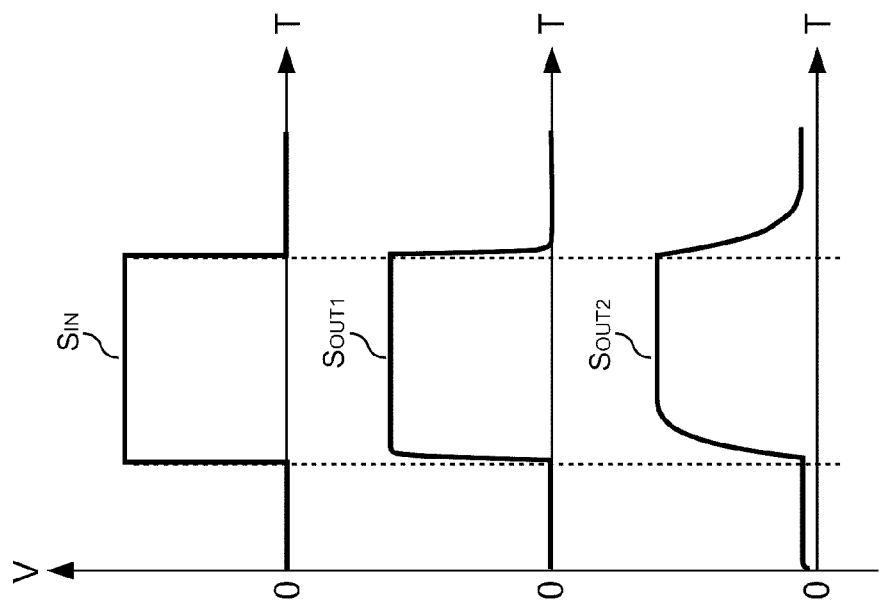

LOW-PASS FILTER

BACKGROUND OF THE INVENTION

1. Field of the Invention

The present invention relates to a low-pass filter, and more particularly to a low pass-filter capable of being integrated in the integrated circuit and reduce the prime cost.

2. Description of the Prior Art

Power supplies are widely applied to provide regulated voltage and current for various electronic products. To improve the stability of the power supplies, compensation capacitors are usually coupled to the control integrated circuit (controller chip) of the power supplies externally. Thus, extra pins must be added to the controller chip for coupling to the external compensation capacitors, which increases the packaging cost of the controller chip. Furthermore, since the external compensation capacitors are usually bulk capacitors, they will occupy considerable layout space if they are integrated within the controller chip. Detailed explanation is given below to describe disadvantages of the above. Referring to FIG. 1, it shows a conventional power supply disclosed in U.S. Pat. No. 7,362,592 (Yang). The conventional power supply comprises a transformer 10 having a primary winding $N_P$, a secondary winding $N_S$, and an auxiliary winding $N_A$. A terminal of the primary winding $N_P$ is coupled to an input voltage $V_{IN}$. A transistor 20 is coupled to another terminal of the primary winding $N_P$ and a ground reference via a resistor 30. A controller 70 has a supply terminal VCC, a ground terminal GND, a detection terminal DET, a sense terminal CS, a pulse width modulation terminal VPWM, a voltage-compensation terminal COMV, and a current-compensation terminal COMI. The pulse width modulation terminal VPWM of the controller 70 generates a switching signal $V_{PWM}$ to control the transistor 20 for switching the transformer 10 and regulating the output voltage $V_O$ and/or the output current $I_O$ of the power supply.

A terminal of the secondary winding $N_S$ is coupled to a rectifier 40. Two terminals of a filter capacitor 45 are respectively coupled to the rectifier 40 and another terminal of the secondary winding $N_S$. The transformer 10 stores energy when the transistor 20 is turned on. Once the transistor 20 is turned off, the energy stored in the transformer 10 is released to an output terminal of the power supply via the secondary winding $N_S$, and a secondary-side switching current $I_S$, an output current $I_O$ and an output voltage $V_O$ are generated accordingly. Meanwhile, a reflected voltage $V_{AUX}$ is generated at the auxiliary winding $N_A$ of the transformer 10. The reflected voltage $V_{AUX}$ charges a capacitor 65 via a rectifier 60. The capacitor 65 is coupled to the supply terminal VCC of the controller 70 to power the controller 70.

The detection terminal DET of the controller 70 is coupled to a joint of the resistors 50 and 51 of a voltage divider. A terminal of the resistor 50 is coupled to the auxiliary winding $N_A$. A terminal of the resistor 51 is coupled to the ground reference and the ground terminal GND of the controller 70. The detection terminal DET is coupled to receive a detection voltage $V_{DET}$. The sense terminal CS of the controller 70 is coupled to the resistor 30 which serves as a current-sense resistor for converting a primary-side switching current $I_P$ into a current signal $V_{CS}$. The controller 70 generates the switching signal $V_{PWM}$ at the pulse width modulation terminal VPWM for switching the transformer 10 in response to the detection voltage $V_{DET}$ at the detection terminal DET and the current signal $V_{CS}$ at the sense terminal CS.

Furthermore, the voltage-compensation terminal COMV and the current-compensation terminal COMI of the controller 70 are respectively coupled to the capacitors 31 and 32 for voltage-loop frequency compensation and current-loop frequency compensation to improve the stability of the power supply. The controller 70 therefore needs two extra pins for coupling the external capacitors 31 and 32. Since the capacitors 31 and 32 are bulk capacitors, they are inappropriate to integrate within the controller 70. The main problem that the power supply manufacturers have to solve is how to integrate the external capacitors 31 and 32 within the controller 70 with a smaller layout space, which saves the pin counts of the controller 70 and therefore reduces the packaging cost thereof.

Bulk capacitors, such as capacitors 31 and 32 mentioned above, are necessary components for low-pass filters which are utilized for frequency compensation. Nowadays, although various types of low-pass filters are able to integrate within the controller chip, they still failed to meet low bandwidth requirement of power supplies. This is because most of their bandwidths are too high due to the consideration of saving layout space.

Referring to FIG. 2, it shows a circuit diagram of conventional switched-capacitor low-pass filter. The conventional switched-capacitor low-pass filter comprises a first capacitor 75, a second capacitor 76, a first switch 77, and a second switch 78. The first switch 77 is coupled in between an input terminal IN of the low-pass filter and the first capacitor 75. The second switch 78 is coupled in between the first capacitor 75 and the second capacitor 76. The second capacitor 76 is coupled to an output terminal OUT of the switched-capacitor low-pass filter. The input terminal IN of the low-pass filter receives an input signal $S_{IN}$. The first capacitor 75 and the second capacitor 76 filter the input signal $S_{IN}$ for generating an output signal $S_{OUT1}$ at the output terminal OUT of the low-pass filter.

Referring to FIG. 7, it shows the waveforms of the input signal $S_{IN}$ and the output signal $S_{OUT1}$ shown in FIG. 2. The capacitance of the second capacitor 76 of the low-pass filter, for example, is twenty times that of the first capacitor 75. The low-pass filter shown in FIG. 2 filters the input signal $S_{IN}$ to generate the output signal $S_{OUT1}$. As shown in FIG. 7, the difference between the waveform of the input signal $S_{IN}$ and the waveform of the output signal $S_{OUT1}$ is small. That is, the bandwidth of the low-pass filter is not low enough, and therefore the medium-high frequency harmonic of the input signal $S_{IN}$ cannot be filtered efficiently. In order to improve the filtering efficiency of the low-pass filter shown in FIG. 2, when the frequency to switch the capacitor is kept constant, the ratio of the capacitance of the second capacitor 76 to the capacitance of the first capacitor 75 must be increased. The integrated layout space of the second capacitor 76 will therefore inevitably increase, which also increases the integration cost of the controller chip.

In addition to the low-pass filter described above, there are also other types of low-pass filters. For example, U.S. Pat. No. 7,049,883 (Makino et al.) disclosed an active low-pass filter which cannot apply a smaller capacitance of capacitor to meet the low bandwidth requirement of the controller 70 of the power supply.

The present invention provides a low-pass filter solution to the problems described above, which utilizes capacitors having smaller capacitance to achieve the same low-pass filtering performance as the external compensation capacitor having bulk capacitance does in conventional techniques. The present invention further facilitates the integration of the controller chip and reduces the prime cost enormously.

SUMMARY OF THE INVENTION

The purpose of the present invention is to provide a low-pass filter. The low-pass filter controls a plurality of small capacitors integrated in the controller chip that can achieve the same low-pass filtering performance as the external compensation capacitor having bulk capacitance does in conventional techniques.

Another purpose of the present invention is to provide a low-pass filter which is integrated in the control chip for reducing the prime cost.

The low-pass filter according to the present invention including a plurality of filter units connected cascaded with each other. These filter units receive an input signal and filter the input signal to generate an output signal. A regulation unit is coupled to the filter units for regulating the voltage levels of the filter units. Due to the low-pass filter of the present invention is capable of being integrated in the chip completely, the integrated layout space is smaller than that of the prior-art. Therefore, the prime cost is reduced enormously.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention.

FIG. 7 shows waveforms of an input signal, an output signal of the low-pass filter of the present invention and the waveform of an output signal of the conventional low-pass filter.

FIG. 8 shows a block diagram of an embodiment of the low-pass filter according to the present invention.

FIG. 9 shows a block diagram of another embodiment of the low-pass filter according to the present invention.

DESCRIPTION OF THE PREFERRED EMBODIMENTS

Figure 1:
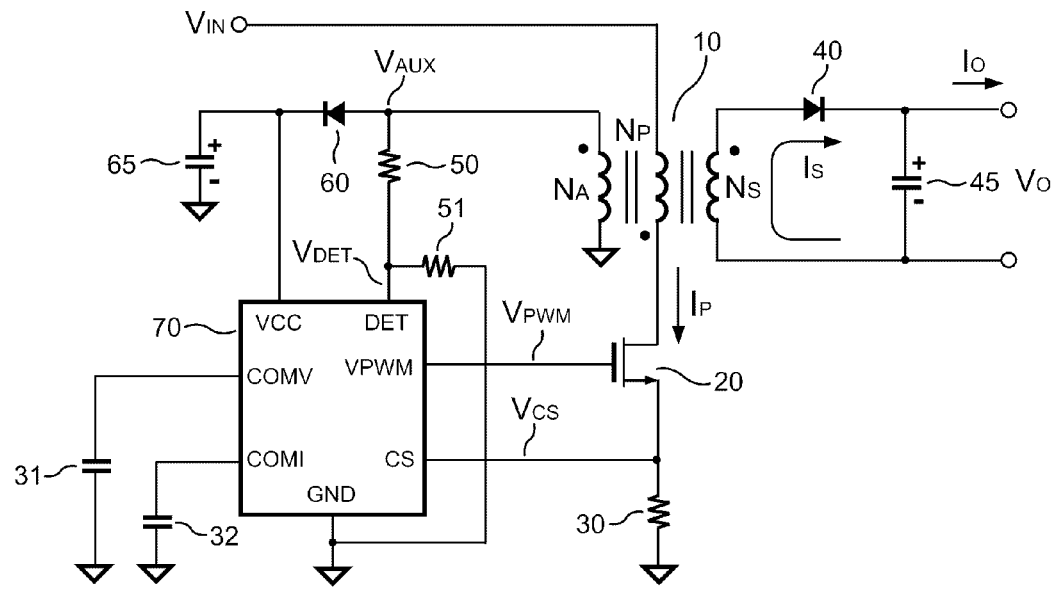
FIG. 1 shows a conventional power supply.
Figure 2:
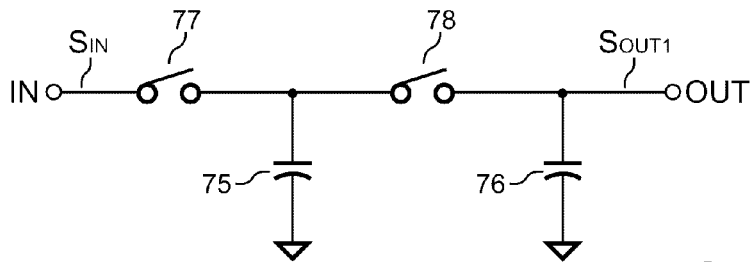
FIG. 2 shows a conventional switched-capacitor low-pass filter.
Figure 3:
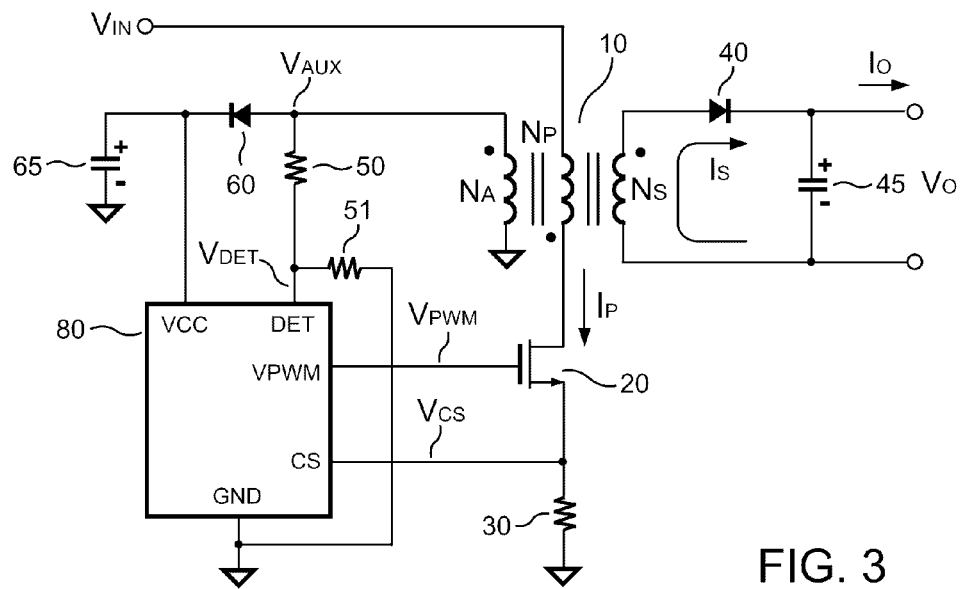
FIG. 3 shows an embodiment of a power supply according to the present invention.

FIG. 3 shows a circuit diagram of an embodiment of the power supply according to the present invention. The power supply includes a transformer 10 having a primary winding $N_P$, a secondary winding $N_S$, and an auxiliary winding $N_A$. The primary winding $N_P$ is coupled to the input voltage $V_{IN}$ and connected to a transistor 20 and a resistor 30 in series. The resistor 30 is coupled to a ground reference. A controller 80 includes a power supply terminal VCC, a ground terminal GND, a detection terminal DET, a sense terminal CS, and a PWM (pulse width modulation) terminal VPWM. The PWM terminal VPWM of the controller 80 generates a switching signal VPWM to control the transistor 20 for switching the transformer 10 and regulating an output voltage $V_O$ and/or an output current $I_O$ of the power supply.

A terminal of the secondary winding $N_S$ is coupled to a rectifier 40. A filter capacitor 45 is coupled between the rectifier 40 and another terminal of the secondary winding $N_S$. When the transistor 20 is turned off, the secondary winding $N_S$ generates a secondary-side switching current $I_S$, the output current $I_O$ and the output voltage $V_O$. Meanwhile, the reflected voltage $V_{AUX}$ is generated at the auxiliary winding $N_A$ of the transformer 10. The reflected voltage $V_{AUX}$ charges a capacitor 65 via a rectifier 60 to provide power to the supply terminal VCC.

Figure 4:
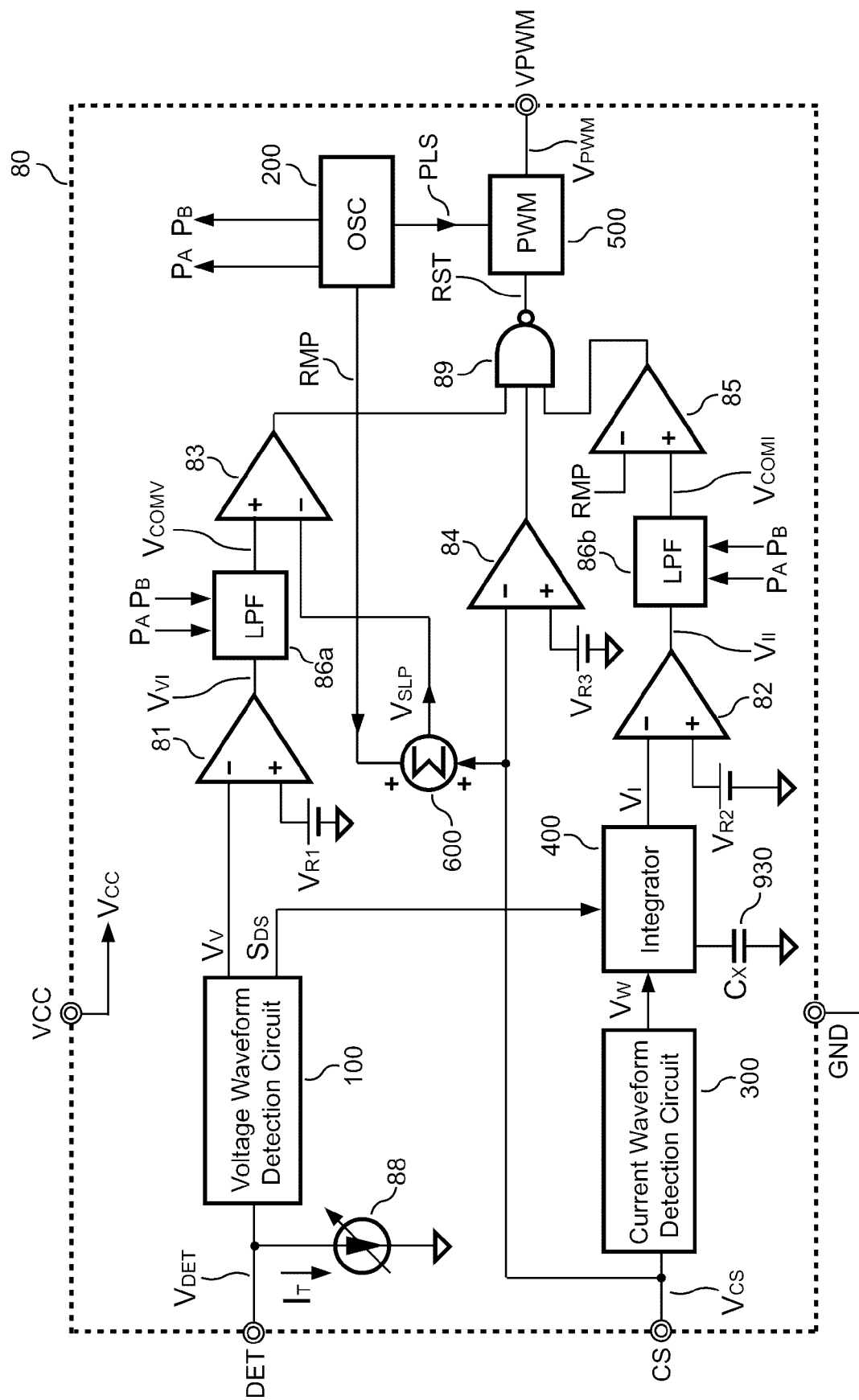
FIG. 4 shows an embodiment of a controller according to the present invention.

A voltage divider including resistors 50 and 51 connected in series is coupled in between the auxiliary winding $N_A$ of the transformer 10 and the ground reference. The detection terminal DET of the controller 80 is coupled to a joint of the resistors 50 and 51 for receiving a detection voltage $V_{DET}$. The sense terminal CS of the controller 80 is coupled to the resistor 30 which serves as a current-sense resistor for converting a primary-side switching current $I_P$ into a current signal $V_{CS}$. The controller 80 generates the switching signal $V_{PWM}$ at the PWM terminal VPWM for switching the transformer 10 in response to the detection voltage $V_{DET}$ at the detection terminal DET and the current signal $V_{CS}$ at the sense terminal CS. Since low-pass filters 86a and 86b (as shown in FIG. 4) according to the present invention are integrated in the controller 80, the controller 80 doesn't need extra pins to connect with external compensation capacitors. The prime cost, such as packaging, is therefore reduced.

FIG. 4 shows an embodiment of the controller 80 according to the present invention. The controller 80 comprises a voltage waveform detection circuit 100 which is coupled to the detection terminal DET to generate a voltage-feedback signal $V_V$ and a discharge-time signal $S_{DS}$ by multi-sampling the detection voltage $V_{DET}$. The discharge-time signal $S_{DS}$ represents a discharge time of the secondary-side switching current $I_S$. The voltage waveform detection circuit 100 multi-samples the detection voltage $V_{DET}$. That is, the voltage waveform detection circuit 100 measures the reflected voltage $V_{AUX}$ (as shown in FIG. 3). A current waveform detection circuit 300 is coupled to the sense terminal CS to generate a current waveform signal $V_W$ by measuring the current signal $V_{CS}$. An oscillator 200 generates an oscillation signal PLS for determining a switching frequency of the switching signal $V_{PWM}$. An integrator 400 is coupled to the voltage waveform detection circuit 100 and the current waveform detection circuit 300 to generate a current-feedback signal $V_I$ by integrating the current waveform signal $V_W$ with the discharge time $T_{DS}$. The integrator 400 is further coupled to a capacitor 930 for correlating the time constant of the integrator 400 with the switching frequency of the switching signal $V_{PWM}$.

A voltage-loop error amplifier comprises an operational amplifier 81 and a reference voltage $V_{R1}$ for amplifying the voltage-feedback signal $V_V$ and providing a loop gain for output voltage control. A negative input terminal of the operational amplifier 81 is coupled to the voltage waveform detection circuit 100 for receiving the voltage-feedback signal $V_V$. A positive input terminal of the operational amplifier 81 is coupled to receive the reference voltage $V_{R1}$. An output terminal of the operational amplifier 81 generates a voltage-loop error signal $V_{VT}$. A current-loop error amplifier comprises an operational amplifier 82 and a reference voltage $V_{R2}$ for amplifying the current-feedback signal $V_I$ and providing a loop gain for output current control. A negative input terminal of the operational amplifier 82 is coupled to the integrator 400 for receiving the current-feedback signal $V_I$. A positive input terminal of the operational amplifier 82 is coupled to receive the reference voltage $V_{R2}$. An output terminal of the operational amplifier 82 generates a current-loop error signal $V_{IT}$.

The low-pass filter 86a is coupled to the output terminal of the operational amplifier 81 for receiving the voltage-loop error signal $V_{VI}$ and filtering the voltage-loop error signal $V_{VI}$ for generating a voltage-loop frequency compensation signal $V_{COMV}$. The low-pass filter 86b is coupled to the output terminal of the operational amplifier 82 for receiving the current-loop error signal $V_{II}$ and filtering the current-loop error signal $V_{II}$ for generating a current-loop frequency compensation signal $V_{COMI}$. The oscillator 200 generates a first control signal $P_A$ and a second control signal $P_B$ to control the low-pass filters 86a and 86b.

A PWM circuit 500, a comparator 83 and a comparator 85 are utilized to generate the switching signal $V_{PWM}$ and control the pulse-width of the switching signal $V_{PWM}$ in response to the output of the voltage-loop error amplifier and the output of the current-loop error amplifier. The PWM circuit 500 is coupled to the PWM terminal VPWM for outputting the switching signal $V_{PWM}$. A positive input terminal of the comparator 83 is coupled to an output terminal of the low-pass filter 86a for receiving the voltage-loop frequency compensation signal $V_{COMV}$. A negative input terminal of the comparator 83 is coupled to the output terminal of an adder 600 for receiving a slop signal $V_{SLP}$. The adder 600 adds the current signal $V_{CS}$ with a ramp signal RMP generated by the oscillator 200 to generate the slope signal $V_{SLP}$ which performs slope compensation for the voltage-loop. A positive input terminal of the comparator 85 is coupled to an output terminal of the low-pass filter 86b to receive the current-loop frequency compensation signal $V_{COMI}$. A negative input terminal of the comparator 85 is coupled to receive the ramp signal RMP from the oscillator 200.

A positive input terminal of a comparator 84 is coupled to receive a reference voltage $V_{R3}$. A negative input terminal of the comparator 84 is coupled to the sense terminal CS to receive the current signal $V_{CS}$ for achieving a cycle-by-cycle current limit. Three input terminals of a NAND gate 89 are respectively coupled to the output terminals of the comparators 83, 84 and 85. An output terminal of the NAND gate 89 generates a reset signal RST. The reset signal RST is applied to the PWM circuit 500 for controlling the duty cycle of the switching signal $V_{PWM}$. The supply terminal VCC of the controller 80 provides a supply voltage $V_{CC}$ for internal circuitries of the controller 80.

A current control loop is formed from the detection of the primary-side switching current $I_P$ to the pulse width modulation of the switching signal $V_{PWM}$ for controlling the magnitude of the primary-side switching current $I_P$ in response to the reference voltage $V_{R2}$. The current waveform detection circuit 300 detects the current signal $V_{CS}$ and generates the current waveform signal $V_W$. The integrator 400 further generates the current-feedback signal $V_I$ by integrating the current waveform signal $V_W$ with the discharge-time signal $S_{DS}$. Thus, the current-feedback signal $V_I$ is proportional to the output current $I_O$ of the power supply. The current-feedback signal $V_I$ is increased as the output current $I_O$ increases. A maximum value of the current-feedback signal $V_I$ is limited to the value of the reference voltage $V_{R2}$ via the regulation of the current control loop. A maximum output current $I_{O(max)}$ can be regulated as a constant current by the loop control of the current control loop in response to the reference voltage $V_{R2}$.

Besides, a voltage control loop is developed from the sampling of the reflected voltage $V_{AUX}$ to the pulse width modulation of the switching signal $V_{PWM}$ that controls the magnitude of the reflected voltage $V_{AUX}$ in response to the reference voltage $V_{R1}$. Since the reflected voltage $V_{AUX}$ is proportional to the output voltage $V_O$, the output voltage $V_O$ can be controlled by controlling the magnitude of the reflected voltage $V_{AUX}$. The reflected voltage $V_{AUX}$ is attenuated to the detection voltage $V_{DET}$ as shown in FIG. 3. The voltage waveform detection circuit 100 generates the voltage-feedback signal $V_V$ by multi-sampling the detection voltage $V_{DET}$. That is, the voltage waveform detection circuit 100 generates the voltage-feedback signal $V_V$ by multi-sampling the reflected voltage $V_{AUX}$. The value of the voltage-feedback signal $V_V$ is controlled for controlling the output voltage $V_O$ in response to the value of the reference voltage $V_{R1}$ via the regulation of the voltage control loop. According to the above description, the PWM circuit 500 generates the switching signal $V_{PWM}$ for regulating the output current $I_O$ and the output voltage $V_O$ in response to the outputs of the current-loop error amplifier and the voltage-loop error amplifier.

Moreover, a programmable current source 88 is coupled to an input terminal of the voltage waveform detection circuit 100 for temperature compensation. The programmable current source 88 generates a programmable current $I_T$ to accurately control the output voltage $V_O$ of the power supply in response to the temperature of the controller 80.

Figure 5:
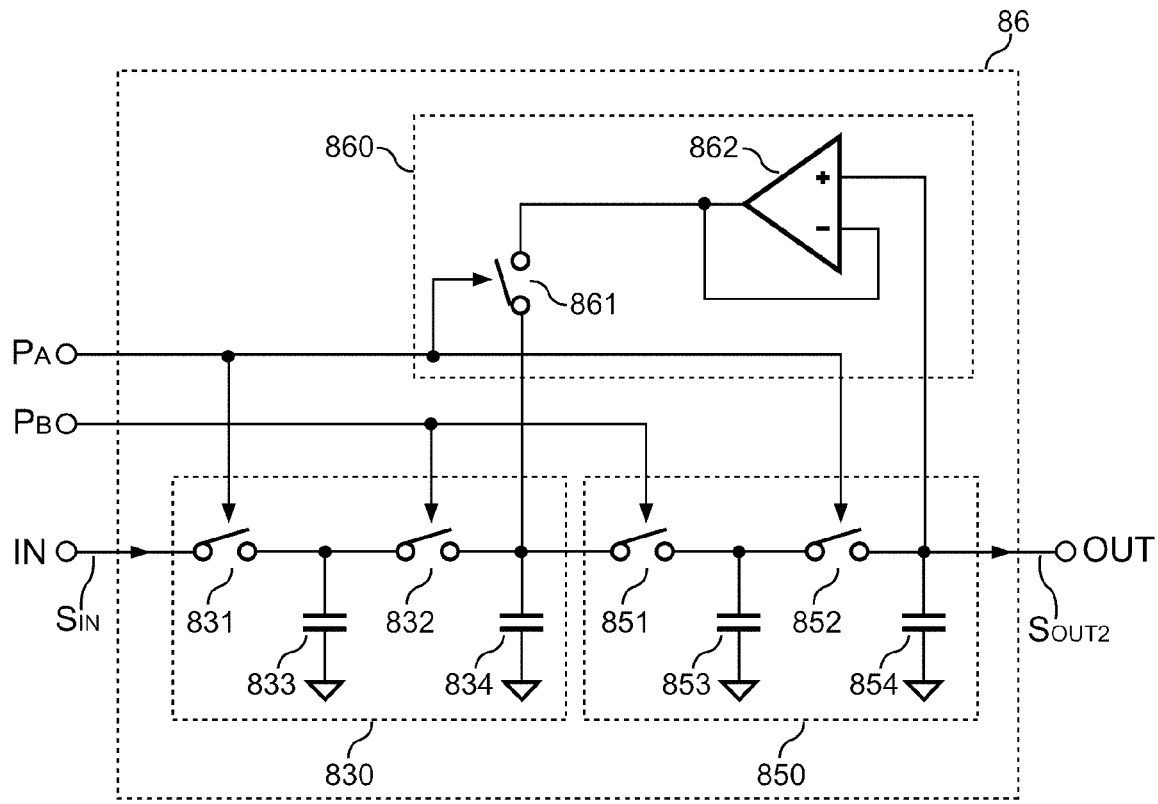
FIG. 5 shows an embodiment of a low-pass filter according to the present invention.

FIG. 5 shows an embodiment of a low-pass filter 86 according to the present invention. The low-pass filter 86 embodies the low-pass filters 86a and 86b as shown in FIG. 4. The low-pass filter 86 comprises a first-stage filter unit 830, a second-stage filter unit 850 and a regulation unit 860. The first-stage filter unit 830 and the second-stage filter unit 850 are connected in series with each other. The first-stage filter unit 830 and the second-stage filter unit 850 can be implemented by a switched-capacitor filter. The first-stage filter unit 830 includes a first switch 831, a second switch 832, a first capacitor 833, and a second capacitor 834. A terminal of the first capacitor 833 and a terminal of the second capacitor 834 are coupled to the ground reference. The first switch 831 is coupled in between an input terminal of the first-stage filter unit 830 and another terminal of the first capacitor 833. The input terminal of the first-stage filter unit 830 is also an input terminal IN of the low-pass filter 86. Another terminal of the second capacitor 834 is coupled to an output terminal of the first-stage filter unit 830. The second switch 832 is coupled in between the first capacitor 833 and the second capacitor 834. The capacitance of the first capacitor 833 is smaller than that of the second capacitor 834. The first switch 831 and the second switch 832 are respectively controlled by the first control signal $P_A$ and the second control signal $P_B$.

The second-stage filter unit 850 includes a third switch 851, a fourth switch 852, a third capacitor 853, and a fourth capacitor 854. A terminal of the third capacitor 853 and a terminal of the fourth capacitor 854 are coupled to the ground reference. The third switch 851 is coupled in between the input terminal of the second-stage filter unit 850 and another terminal of the third capacitor 853. The input terminal of the second-stage filter unit 850 is coupled to the output terminal of the first-stage filter unit 830 to receive a filtered signal generated by the first-stage filter unit 830. Another terminal of the fourth capacitor 854 is coupled to an output terminal of the second-stage filter unit 850. The output terminal of the second-stage filter unit 850 is also an output terminal OUT of the low-pass filter 86. The fourth switch 852 is coupled in between the third capacitor 853 and the fourth capacitor 854. The capacitance of the third capacitor 853 is smaller than that of the fourth capacitor 854. The third switch 851 and the fourth switch 852 are respectively controlled by the second control signal $P_B$ and the first control signal $P_A$.

The regulation unit 860 is utilized to regulate the voltage level of the second capacitor 834 of the first-stage filter unit 830. The regulation unit 860 comprises a switch 861 and an operational amplifier 862. A positive input terminal of the operational amplifier 862 is coupled to the output terminal OUT of the low-pass filter 86. A negative input terminal of the operational amplifier 862 is coupled to an output terminal thereof to serve as a buffer. The switch 861 is coupled in between the output terminal of the operational amplifier 862 and the second capacitor 834 of the first-stage filter unit 830. The switch 861 is controlled by the first control signal $P_A$.

The input terminal IN of the low-pass filter 86 receives an input signal $S_{IN}$. The input signal $S_{IN}$ represents the voltage-loop error signal $V_{VI}$ or the current-loop error signal $V_{II}$ as shown in FIG. 4. The first-stage filter unit 830 and the second-stage filter unit 850 are coupled to filter the input signal $S_{IN}$. The output terminal OUT of the low-pass filter 86 generates an output signal $S_{OUT2}$ which represents the voltage-loop frequency compensation signal $V_{COMV}$ or the current-loop frequency compensation signal $V_{COMI}$ as shown in FIG. 4.

Figure 6:
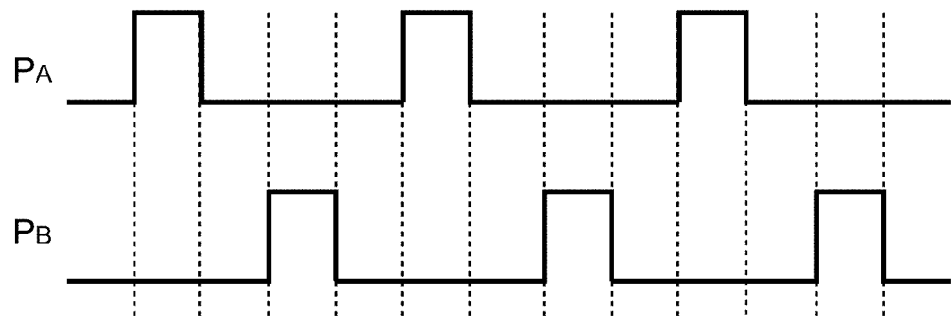
FIG. 6 shows waveforms of control signals according to the present invention.

When the input terminal IN of the low-pass filter 86 receives the input signal $S_{IN}$, as shown in FIG. 6, the first control signal $P_A$ is enabled to turn on the first switch 831 of the first-stage filter unit 830. The input signal $S_{IN}$ then charges the first capacitor 833. After that, the first control signal $P_A$ is disabled to turn off the first switch 831 of the first-stage filter unit 830. After a delay time, the second control signal $P_B$ is enabled, as shown in FIG. 6, to turn on the second switch 832 of the first-stage filter unit 830 and the third switch 851 of the second-stage filter unit 850. Therefore, the voltage signal across the first capacitor 833 of the first-stage filter unit 830 charges the second capacitor 834 of the first-stage filter unit 830. This is an operation that the small capacitor 833 charges the large capacitor 834. Meanwhile, the voltage signal across the first capacitor 833 of the first-stage filter unit 830 also charges the third capacitor 853 of the second-stage filter unit 850. Afterward, the second control signal $P_B$ is disabled to turn off the second switch 832 of the first-stage filter unit 830 and the third switch 851 of the second-stage filter unit 850.

After the delay time, the first control signal $P_A$ is again enabled, as shown in FIG. 6, to turn on the fourth switch 852 of the second-stage filter unit 850. The voltage signal across the third capacitor 853 of the second-stage filter unit 850 then charges the fourth capacitor 854. This is also an operation that the small capacitor 853 charges the large capacitor 854. The fourth capacitor 854 generates the output signal $S_{OUT2}$ accordingly and therefore the low-pass filtering for the input signal $S_{IN}$ is completed.

As shown in FIG. 7, the output signal $S_{OUT2}$ is generated by the output terminal OUT of the low-pass filter 86. According to the FIG. 7, it is to be understood that the efficiency on low-pass filtering of the low-pass filter 86 is much better than that of the conventional techniques. Furthermore, when the second-stage filter unit 850 generates the output signal $S_{OUT2}$, the switch 861 of the regulation unit 860 is turned on in response to the enabling state of the first control signal $P_A$. The regulation unit 860 regulates the voltage level across the second capacitor 834 of the first-stage filter unit 830 in response to the voltage level across the output signal $S_{OUT2}$. The low-pass filter 86 utilizes a first-stage filter unit 830 and a second-stage filter unit 850 coupled in series and the regulation unit 860 to filter the input signal $S_{IN}$. Due to the total capacitance of the capacitors 833, 834, 853 and 854 of the low-pass filter 86 is small, the low-pass filter 86 is ideal to be integrated in the controller chip. This means that the controller chip can achieve good low-pass frequency compensation without connecting external bulk capacitors, which also eliminates extra pins. Moreover, the cost of the packaging and the chip space are reduced enormously.

FIG. 8 shows a block diagram of the low-pass filter 86 in FIG. 5. The low-pass filter 86 comprises the first-stage filter unit 830 and the second-stage filter unit 850 connected in series for filtering the input signal $S_{IN}$. The input signal $S_{IN}$ is received at the input terminal IN and the output signal $S_{OUT2}$ is generated at the output terminal OUT. The low-pass filter 86 further comprises the regulation unit 860 which regulates the output voltage level of the first-stage filter unit 830 in response to the voltage level of the output signal $S_{OUT2}$. According to the above description, the low-pass filter 86 of the present invention is not limited to comprising two stages filter units 830 and 850 connected in series. The low-pass filter 86 of the present invention can also comprises plural stages of filter units connected in series as needed.

FIG. 9 shows a low-pass filter 90 comprising plural filter units 830~990 which are connected in series with each other for filtering the input signal $S_{IN}$. The input signal $S_{IN}$ is received at the input terminal IN and an output signal $S_{OUTN}$ is generated at the output terminal OUT. The low-pass filter 90 further comprises a regulation unit 960 which regulates the voltage levels of the filter units in response to the voltage level of the output signal $S_{OUTN}$.

The low-pass filters 86 and 90 as described above are not only able to apply to the controller 80 shown in FIG. 3 and FIG. 4 but also able to apply to any types of power supplies and to be integrated within any types of controllers for reducing the prime cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims or their equivalents.

What is claimed is:

1. A low-pass filter, comprising:
   a first-stage filter unit, receiving an input signal and filtering said input signal to generate a filtered signal, said first-stage filter unit being charged in accordance with said input signal and a control signal, and therefore having a voltage level;
   a second-stage filter unit, receiving said filtered signal and filtering said filtered signal to generate an output signal; and
   a regulation unit, coupled to said first-stage filter unit and regulating said voltage level of said first-stage filter unit in response to said output signal and a control signal.

2. The low-pass filter as claimed in claim 1, wherein said regulation unit comprises a switch and a buffer which receives said output signal for regulating said voltage level of said first-stage filter unit, said switch is coupled in between an output terminal of said buffer and said first-stage filter unit, said switch is turned on for regulating said voltage level of said first-stage filter unit when said second-stage filter unit filters said filtered signal to generate said output signal.

3. The low-pass filter as claimed in claim 1, wherein said first-stage filter unit and said second-stage filter unit can be implemented by a switched-capacitor filter, respectively.

4. The low-pass filter as claimed in claim 3, wherein said first-stage filter unit and said second-stage filter each comprises:
   a first capacitor;
   a first switch, coupled in between an input terminal of said switched-capacitor filter and said first capacitor;
   a second capacitor, coupled to an output terminal of said switched-capacitor filter; and
   a second switch, coupled in between said first capacitor and said second capacitor.

5. The low-pass filter as claimed in claim 4, wherein said regulation unit regulates said voltage level of said second capacitor of said first-stage filter unit in response to a level of said output signal of said second-stage filter unit.

6. The low-pass filter as claimed in claim 4, wherein the capacitance of said first capacitor is smaller than that of said second capacitor.

7. The low-pass filter as claimed in claim 1, wherein said low-pass filter is integrated within a controller chip of a power supply.

8. A low-pass filter, comprising:
a plurality of filter units, coupled in series with each other and receiving an input signal to filter said input signal for generating an output signal, said filter units being charged in accordance with said input signal and a control signal, and therefore having a voltage level respectively; and
a regulation unit, coupled to said filter units and regulating said voltage levels of said filter units in response to said output signal and a control signal.

9. The low-pass filter as claimed in claim 8, wherein said regulation unit comprises at least one switch and a buffer which receives said output signal for regulating said voltage levels of said filter units, said switch is coupled in between an output terminal of said buffer and said filter units, said switch is turned on for regulating said voltage levels of said filter units when a last-stage filter unit of said filter units generates said output signal.

10. The low-pass filter as claimed in claim 8, wherein said filter units can be implemented by a switched-capacitor filter, respectively.

11. The low-pass filter as claimed in claim 10, wherein each switched-capacitor filter comprises:
a first capacitor;
a first switch, coupled in between an input terminal of said switched-capacitor filter and said first capacitor;
a second capacitor, coupled to an output terminal of said switched-capacitor filter; and
a second switch, coupled in between said first capacitor and said second capacitor.

12. The low-pass filter as claimed in claim 11, wherein the capacitance of said first capacitor is smaller than that of said second capacitor.

13. The low-pass filter as claimed in claim 8, wherein said low-pass filter is integrated within a controller chip of a power supply.

* * * * *